United States Patent
Guibbert et al.

(10) Patent No.: US 10,139,514 B2
(45) Date of Patent: Nov. 27, 2018

(54) METHOD OF DETECTING THE APPROACH OF A USER'S HAND TO A VEHICLE DOOR HANDLE OR THE CONTACT OF A USER'S HAND THEREWITH, AND ASSOCIATED DETECTION DEVICE

(71) Applicants: CONTINENTAL AUTOMOTIVE FRANCE, Toulouse (FR); CONTINENTAL AUTOMOTIVE GmbH, Hannover (DE)

(72) Inventors: Mickael Guibbert, Toulouse (FR); Olivier Elie, Toulouse (FR); Monirat Ung, Seysses (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 86 days.

(21) Appl. No.: 15/429,633

(22) Filed: Feb. 10, 2017

(65) Prior Publication Data
US 2017/0235008 A1    Aug. 17, 2017

(30) Foreign Application Priority Data
Feb. 12, 2016    (FR) .................................... 16 51142

(51) Int. Cl.
*G01V 3/08*    (2006.01)
*B60R 25/24*    (2013.01)
(Continued)

(52) U.S. Cl.
CPC ............... *G01V 3/08* (2013.01); *B60R 25/24* (2013.01); *E05B 81/77* (2013.01); *E05B 81/78* (2013.01);
(Continued)

(58) Field of Classification Search
CPC ........ G01R 27/00; G01R 27/02; G01R 27/26; G01R 27/2605; G01D 5/24; G01D 5/2405;
(Continued)

(56) References Cited

U.S. PATENT DOCUMENTS 7,768,272 B2 * 8/2010 Kato .................... H03K 17/955
                                                                324/663
8,970,288 B2    3/2015 Hourne et al.
(Continued)

FOREIGN PATENT DOCUMENTS

CN    102747893 A    10/2012
CN    102983851 A    3/2013
(Continued)

OTHER PUBLICATIONS

FR Search Report, dated Oct. 11, 2016, from corresponding FR application.

*Primary Examiner* — Hoai-An D Nguyen
(74) *Attorney, Agent, or Firm* — Young & Thompson

(57) ABSTRACT

Disclosed is a method of detecting the approach and/or contact of a user's hand to a door handle, the handle having a first outer surface oriented toward the vehicle and a second outer surface oriented toward the user, the handle including at least one detection electrode and an additional electrode, positioned face to face in advance. The method includes: the two electrodes are electrically connected to the same power supply source; a first capacitance value is measured at the terminals of the detection electrode; a second capacitance value is measured at the terminals of the additional electrode; and the first and second values are compared, during a measurement period, with one another and/or with a predetermined threshold value, in order to detect the approach of a user's hand toward the first outer surface or (Continued)

toward the second outer surface and/or the contact of his hand with one of these surfaces.

20 Claims, 4 Drawing Sheets

(51) Int. Cl.
*G01R 27/26* (2006.01)
*H03K 17/955* (2006.01)
*E05B 81/78* (2014.01)
*E05B 85/10* (2014.01)
*G01D 5/24* (2006.01)

(52) U.S. Cl.
CPC .......... *E05B 85/10* (2013.01); *G01R 27/2605* (2013.01); *G01V 3/088* (2013.01); *H03K 17/955* (2013.01); *G01D 5/24* (2013.01); *G01D 5/2405* (2013.01); *H03K 2217/960765* (2013.01)

(58) Field of Classification Search
CPC .......... G06F 3/03; G06F 3/041; G06F 3/0428; G06F 3/044; G01V 3/08; G01V 3/088; E05B 81/77; E05B 81/78; E05B 85/10; B60R 25/24; H03K 17/955; H03K 2217/960765

USPC ....... 324/600, 649, 658, 663, 664, 665, 672, 324/679, 684, 686; 345/173, 174; 702/47, 52
See application file for complete search history.

(56) References Cited

U.S. PATENT DOCUMENTS

| | | |
|---|---|---|
| 2003/0122556 A1 | 7/2003 | Sueyoshi et al. |
| 2008/0122454 A1* | 5/2008 | Kato ................ G01D 3/032 324/661 |
| 2012/0167642 A1 | 7/2012 | Savant et al. |
| 2014/0361826 A1 | 12/2014 | Hourne et al. |
| 2016/0098877 A1* | 4/2016 | Tokudome ........ G07C 9/00944 340/5.72 |
| 2016/0138941 A1* | 5/2016 | Hirota ............. H03K 17/962 340/5.2 |
| 2016/0139285 A1* | 5/2016 | Tsuji ............... H03K 17/955 324/679 |

FOREIGN PATENT DOCUMENTS

| | | |
|---|---|---|
| CN | 104237949 A | 12/2014 |
| DE | 10 2007 051495 A1 | 5/2009 |
| FR | 3 006 793 A1 | 12/2014 |

* cited by examiner

METHOD OF DETECTING THE APPROACH OF A USER'S HAND TO A VEHICLE DOOR HANDLE OR THE CONTACT OF A USER'S HAND THEREWITH, AND ASSOCIATED DETECTION DEVICE

FIELD OF THE INVENTION

The invention relates to a device for detecting a user's presence, a vehicle door handle comprising said device, and a detection method of the associated handle. More particularly, the invention is applicable to devices for detecting a user's presence, integrated into a motor vehicle door handle. These devices detect the approach of a user's hand to the handle and/or the contact of a user's hand with the handle.

BACKGROUND OF THE INVENTION

At the present time, vehicle door handles are equipped with devices for detecting a user's presence. The detection of a user's presence, combined with the recognition of a "hands-free" remote access control badge worn by the user, enables the openable body sections of the vehicle to be locked and unlocked remotely. Thus, when the user wearing the corresponding electronic badge identified by the vehicle approaches the handle or touches the door handle of his vehicle, the openable body sections of the vehicle are automatically unlocked. When the user approaches or presses on a precise location on the vehicle door handle, called the "unlocking area", the door opens without any need to unlock it manually. Conversely, when the user, still wearing the necessary badge and identified by the vehicle, wishes to lock his vehicle, he closes the door of his vehicle and approaches or momentarily presses another precise location on the handle, called the "locking area". By means of this gesture, the openable body sections of the vehicle are automatically locked.

These presence detection devices usually comprise two capacitive sensors, in the form of two electrodes connected electrically to a printed circuit and integrated into the handle, each in a precise locking or unlocking area. Usually, one electrode is dedicated to each area; that is to say, one electrode is dedicated to the detection of the approach and/or the contact of the user's hand in the locking area, and one electrode is dedicated to the approach and/or the contact of the user's hand in the unlocking area. When supplied with power, an electrode emits an electric field which defines a detection area (a locking area or an unlocking area). The approach of a user's hand to this detection area perturbs this electric field and changes the capacitance as seen by said electrode. By measuring the variation of this capacitance, it is therefore possible to detect the approach of the user's hand to said area, that is to say toward the handle in the present case. When this detection has taken place, the capacitive sensor then sends an unlocking or locking instruction to the door unlocking and locking system.

The two areas, for locking and unlocking, are located at different points on the handle, and the electric fields emitted by the respective electrodes must not overlap.

More precisely, for each detection electrode, a high level of detection sensitivity in its respective area is desirable, to avoid non-detection (where detection does not take place when the hand approaches the electrode).

For this purpose, there is a known way of positioning a conductive element (such as a copper sheet) connected to the electrical ground on the side of the electrode where detection is not desired. This conductive element connected to the ground attracts the electric field emitted by the electrode, and provides shielding from the electric field emitted by said electrode on the side where the element is located.

As there is limited space in a vehicle door handle, there is a known way of integrating the conductive element and the two electrodes into each of the two faces of the printed circuit respectively.

Purely for the purposes of explanation, only one electrode will be discussed here, this being the electrode dedicated to the unlocking area. A prior art device is described with reference to FIG. 1.

FIG. 1 shows a door handle 10 of a motor vehicle (vehicle not shown) in which a device D for detecting a user's presence is located. The detection device D is supplied with a voltage of Vcc and is grounded by an electrical connection L connected to the vehicle V.

Said door handle 10 comprises a first outer surface S1 oriented toward the door (not shown) and a second outer surface S2, opposed to the first surface S1 and therefore oriented toward the opposite side from the vehicle, or more precisely toward the user (not shown). This detection device D comprises a first unlocking electrode 12, having one face located near the first outer surface S1, a locking electrode 14 located near the second outer surface S2, control means 13, and a conductive element 11 having one face located near the second outer surface S2. The unlocking electrode 12, the locking electrode 14 and the conductive element 11 are connected to the control means 13. The control means 13 comprise electronic components, and measure the capacitance seen by the electrode 12 in order to detect a user's presence. The conductive element 11 is connected to the ground by the control means 13 and provides a shielding function. These control means 13 are, for example, a printed circuit comprising a microcontroller 20 (not shown). This detection device D defines a detection area A (which is the unlocking area in the example shown in FIG. 1) located between the first outer surface S1 and the vehicle door, and having dimensions which are estimated in a reference frame formed by three perpendicular axes X, Y, Z. In the rest of the description, only the unlocking electrode 12 dedicated to the unlocking area A will be considered, although the invention is also applicable to the electrode dedicated to the locking area (not shown). As shown in FIG. 1, the unlocking area A is considered to be an area located between the handle 10 and the vehicle. This unlocking area A is also called the "sensitivity" of the detection device D.

The conductive element 11, located between the second outer surface S2 and the unlocking electrode 12, therefore provides detection of the approach of the user's hand in the unlocking area A only; in other words, it provides detection toward the first outer surface S1, and prevents any approach detection on the front face of the handle P, that is to say toward the second surface S2.

However, the proximity of the conductive element 11 to the electrode 12 creates strong electromagnetic coupling between the electrode 12 and the electrical ground, as a result of which the detection sensitivity of said electrode 12 is reduced.

In other words, the unlocking area A, which extends from the unlocking electrode 12, is small, and does not cover the space between the first outer surface S1 of the handle P and the surface of the door S' located opposite (see the surface S1).

Thus the user's hand will not be detected if it is located nearer to the surface of the door S' than to the first outer surface S1.

SUMMARY OF THE INVENTION

It is therefore desirable to improve the detection sensitivity of the electrode 12, while ensuring that there are no false positives on the front face of the handle P.

The invention therefore proposes a method of detecting the approach of a user's hand toward a vehicle door handle and/or the contact of the hand therewith, the handle having a first outer surface oriented toward the vehicle and a second outer surface oriented toward the user, said handle comprising at least one detection electrode and an additional electrode, said method consisting in positioning said two electrodes face to face in advance, and comprising the following steps:

Step 1: the detection electrode and the additional electrode appendix are electrically connected to the same power supply source, Step 2: a first value of capacitance is measured at the terminals of the detection electrode, Step 3: a second value of capacitance is measured at the terminals of the additional electrode, Step 4: the first value and the second value are compared, during a measurement period, with one another and/or with a predetermined threshold value, in order to detect the approach of a user's hand toward the first outer surface or toward the second outer surface and/or the contact of his hand with one of these surfaces.

In a second embodiment of the invention, the method comprises, between step 1 and step 2, the following step:

Step 1b: the voltage at the terminals of the additional electrode is reduced to a value lower than that of the supply voltage, And, between step 2 and step 3, the following step:

Step 2b: the voltage at the terminals of the detection electrode is reduced to a value lower than that of the supply voltage.

Preferably, in step 1 b, the additional electrode is electrically connected to the electrical ground, and/or, in step 3b, the detection electrode is electrically connected to the electrical ground.

It is advisable for steps 1 to 3 to be repeated recurrently at a predetermined frequency throughout the measurement period.

Advantageously, in the case of the first embodiment, if, during the measurement period, the first value is greater than the second value, and the first and second value are greater than the predetermined threshold value, then Step 5: the approach detection is validated, otherwise Step 6: there is no validation of the detection.

For the second embodiment, step 4 consists of:

Step 4b: if, during the measurement period, the first value is greater than the predetermined threshold value, and if the second value is lower than the predetermined threshold value, then Step 5: the approach detection is validated, otherwise Step 6: there is no validation of the detection.

In a particular embodiment, the detection electrode being located near the first outer surface and the additional electrode being located between the second outer surface and the detection electrode, said method is characterized in that, in step 4, the approach detection consists in detection toward the first outer surface.

The invention also relates to a device for detecting the approach of a user's hand toward a vehicle door handle and/or the contact of the hand therewith, the handle having a first outer surface oriented toward the vehicle and a second outer surface oriented toward the user, said device comprising at least one voltage source, a detection electrode, an additional electrode, and means for measuring a first value of capacitance at the terminals of the detection electrode and second value of capacitance at the terminals of the additional electrode, said device being remarkable in that said two electrodes are positioned face to face, and in that it further comprises:

first means for connecting the detection electrode to the measurement means, second means for connecting the additional electrode to the measurement means, control means for controlling the first and second connection means, as well as means for adjusting the voltage at the terminals of the detection electrode and the voltage at the terminals of the additional electrode, a clock connected to the control means, means for comparing the first value and the second value with one another and/or with a predetermined threshold value.

Advantageously, the detection device further comprises means for calculating a mean of the first value and means for calculating a mean of the second value during a measurement period, and means for comparing the average of the first value and the average of the second value with one another and/or with the predetermined threshold value.

The invention is equally applicable to any door handle of a motor vehicle comprising a detection device according to any of the characteristics stated above.

Finally, the invention relates to any motor vehicle comprising a detection device according to any of the characteristics stated above.

BRIEF DESCRIPTION OF THE DRAWINGS

Other objects, characteristics and advantages of the invention will be apparent from a reading of the following description, provided by way of non-limiting example, and from a perusal of the appended drawings, in which.

DETAILED DESCRIPTION OF THE INVENTION

Figure 1:
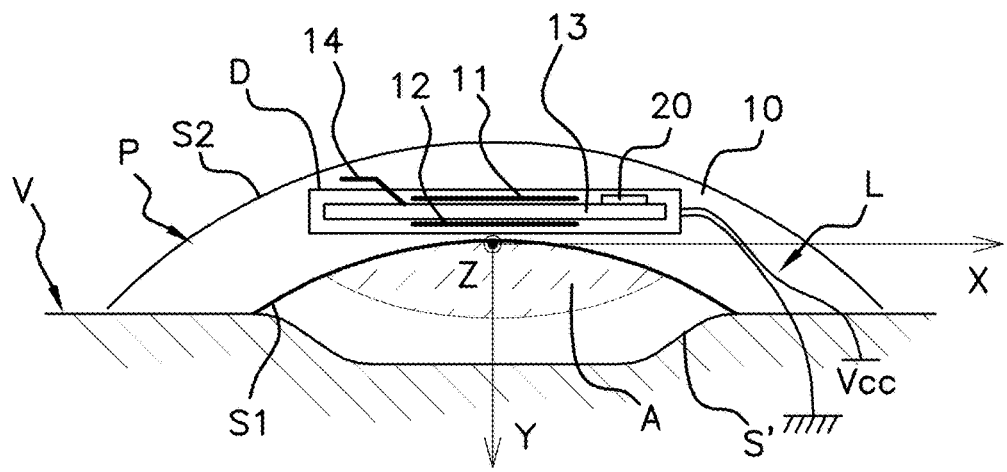
FIG. 1, explained above, shows schematically the detection device D according to the prior art, integrated into a handle P of a motor vehicle V.
Figure 2:
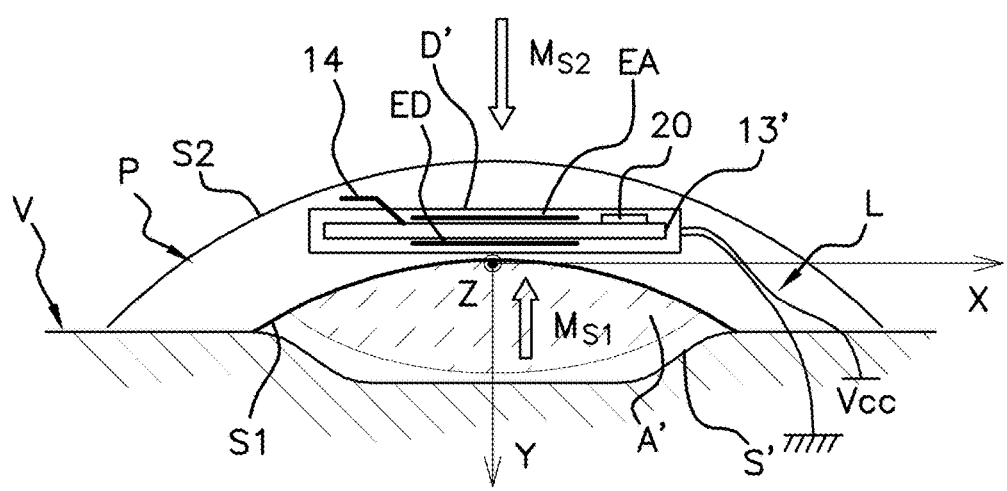
FIG. 2 shows schematically the detection device D' according to the invention, integrated into the handle P of a motor vehicle V.

The detection device D' for detecting the approach and/or contact of a user's hand is illustrated in FIG. 2.

Said detection device D' comprises (see FIG. 2) a detection electrode ED, an additional electrode EA, a locking electrode 14, and control means 13' in the form of a microcontroller 20 and/or printed circuit connected to said two electrodes ED, EA.

The detection device D' is supplied with a voltage of Vcc and is grounded by means of a wire connection L electrically connected to the vehicle V.

In FIG. 2, the detection electrode ED is located in the handle P near the first outer surface S1. The detection electrode ED detects the approach of a user's hand in an unlocking detection area A' located between the handle and the vehicle, and more particularly between the first outer surface S1 and the surface of the door S' of the vehicle, facing the handle P.

The detection electrode ED, in the example shown in FIG. 2, is an unlocking detection electrode.

The invention will be explained here with reference to an unlocking detection device D and the detection electrode ED designed for unlocking the door of the vehicle V; clearly, however, the invention may be applied, mutatis mutandis, to a locking detection device of the vehicle and to the locking electrode 14 which is located near the second outer surface S2 of the vehicle V.

The additional electrode EA is an electrode located between the detection electrode ED and the second outer surface S2.

Preferably, the detection electrode ED and the additional electrode EA are placed face to face. Said two electrodes ED, EA are each composed of a surface of conductive metal, for example copper, with a rectangular shape for example, the surfaces being located in two parallel planes having the longitudinal axis X of the handle P as their principal axis. The detection electrode ED and the additional electrode EA have substantially equal surface areas.

In other words, the detection electrode ED and the electrode EA are oriented in such a way that each respective electrode surface is perpendicular to the direction of approach of a user's hand, that is to say perpendicular to the directions indicated in FIG. 2 by the respective arrows $M_{S2}$, representing an approach toward the second surface S2, and $M_{S1}$, representing an approach toward the first surface S1.

For example, the detection electrode ED and the electrode EA are printed in copper on two opposite faces of the same printed circuit.

Figure 3:
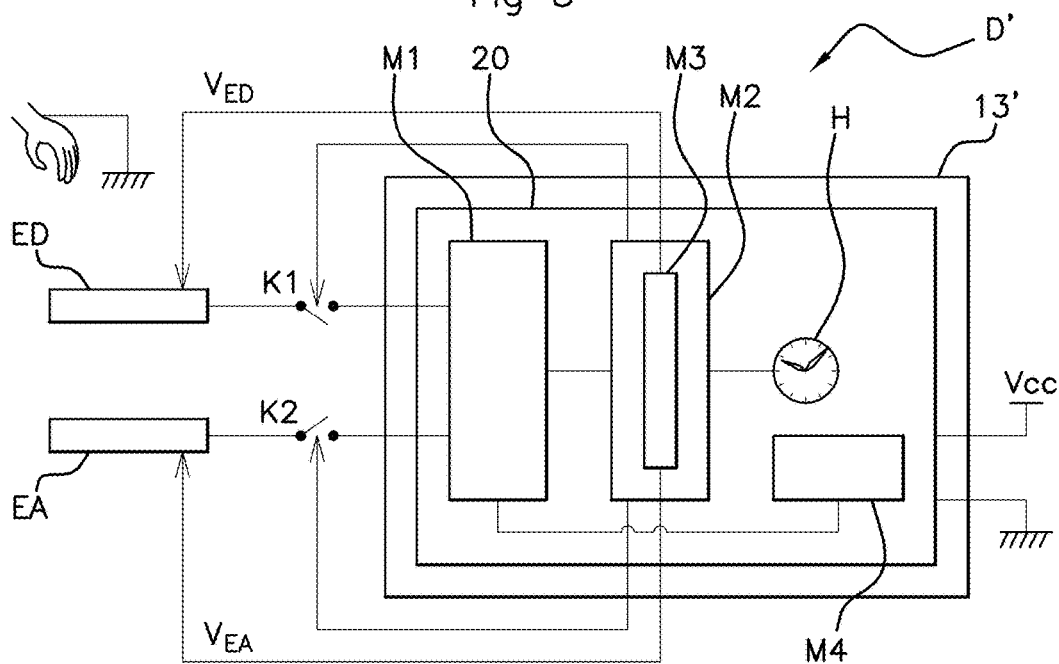
FIG. 3 shows schematically the detection device D' of the invention.

The two electrodes ED, EA are connected to control means 13', comprising a microcontroller 20 integrated into a printed circuit (see FIG. 3).

By contrast with the prior art, in which a conductive element 11 was permanently connected to the ground, the invention here proposes that the conductive element, that is to say the additional electrode EA, be connected alternately to the electrical ground and to a voltage source Vcc.

The two electrodes ED, EA receive a supply voltage Vcc through the microcontroller 20, and each has a value of capacitance at its terminals, namely a first value of capacitance $C_{ED}$ and a second value of capacitance $C_{EA}$ respectively, these values varying on the approach of a user's hand.

The microcontroller 20 comprises means M1 for measuring the first value of capacitance $C_{ED}$ and the second value of capacitance $C_{EA}$.

The variation of capacitance at the terminals of an electrode on the approach of an electrical ground (the user's hand) and the method and means for measuring said variation are known from the prior art and will not be described in further detail here.

According to the invention, the microcontroller 20 also comprises (see FIG. 3):
  first connection means K1 for connecting the detection electrode ED to the measurement means M1,
  second connection means K2 for connecting the additional electrode EA to the measurement means M1,
  control means M2 for controlling the first and second connection means K1, K2, as well as
  means M3 for adjusting the voltage at the terminals of the detection electrode $V_{ED}$ and the voltage at the terminals of the additional electrode $V_{EA}$,
  and a clock H.

The first connection means K1 and the second connection means K2 may be, for example, switches (see FIG. 3) located, respectively, between the measurement means M1 and the detection electrode ED and between the measurement means M1 and the additional electrode EA, these switches, in the closed position, connecting the measurement means M1 electrically to the detection electrode ED (or the additional electrode EA respectively), and enabling the first value of capacitance $C_{ED}$ (or the second value de capacitance $C_{EA}$ respectively) to be measured, whereas in the open position the switches disconnect the measurement means M1 from the detection electrode ED (or from the additional electrode EA respectively), thus preventing the measurement of the first value of capacitance $C_{ED}$, (or the second value of capacitance $C_{EA}$ respectively).

The control means M2 for controlling the first and second connection means K1, K2 are software means, integrated into the microcontroller 20.

The means M3 for adjusting the voltage at the terminals of the detection electrode $V_{ED}$ and the voltage at the terminals of the additional electrode $V_{EA}$ consist, for example, of digital-analog converters electrically connected to the detection electrode ED and the additional electrode EA, enabling the voltage at the terminals of each electrode ED, EA to be adjusted in stages (see FIG. 3).

The voltages at the terminals of the detection electrode ED and at the terminals of the additional electrode EA may be controlled independently of one another, from a minimum value equal to the electrical ground to a maximum value equal to the supply voltage Vcc.

The microcontroller 20 also comprises a clock H connected to the control means M1 so as to control the first connection means K1 and the second connection means M2 at a given instant and for a predetermined time interval.

The clock H is, for example, an electronic clock forming an intrinsic part of the microcontroller 20, for example an oscillator. The clock may equally well be external to the microcontroller 20.

The microcontroller 20 also comprises means M4 for comparing the first value of capacitance $C_{ED}$ of the detection electrode ED and the second value of capacitance $C_{EA}$ of the additional electrode EA with a predetermined threshold value T of capacitance.

The detection method according to the invention is described below and illustrated in FIG. 6.

In a first stage (step E1), the voltage adjustment means M3 set the voltage at the terminals of the detection electrode VED and the voltage at the terminals of the additional electrode EA so that the two voltages VED, VEA are equal to the supply voltage VCC and therefore equal to one another.

The supply voltage Vcc is taken to mean the voltage supplied to the electrodes by the microcontroller 20, and said supply voltage Vcc may differ from the voltage supplied by the vehicle to the microcontroller 20.

In a second step (step E2), the control means M2 close the switch K1 and open the switch K2, so that only the detection electrode ED is electrically connected to the measurement means M1, and a first value of capacitance $C_{ED}$ is measured at the terminals of the detection electrode, using the measurement means M1.

Then, in a third step (step E3), the control means M2 open the switch K1 and close the switch K2, so that only the additional electrode ED is electrically connected to the measurement means M1, and a second value of capacitance $C_{EA}$ is measured at the terminals of the additional electrode, using the measurement means M1.

In the fourth step E4, comparison means M4 are used to compare the first value $C_{ED}$ and the second value $C_{EA}$ are compared with one another and/or with a predetermined threshold value of capacitance T, in order to detect the approach of a user's hand toward the first outer surface S1 and/or the contact of his hand with the first outer surface S1. Said comparison enables the detection of a real approach to be distinguished from a false positive, that is to say from an approach toward the second outer surface S2.

Figure 6:
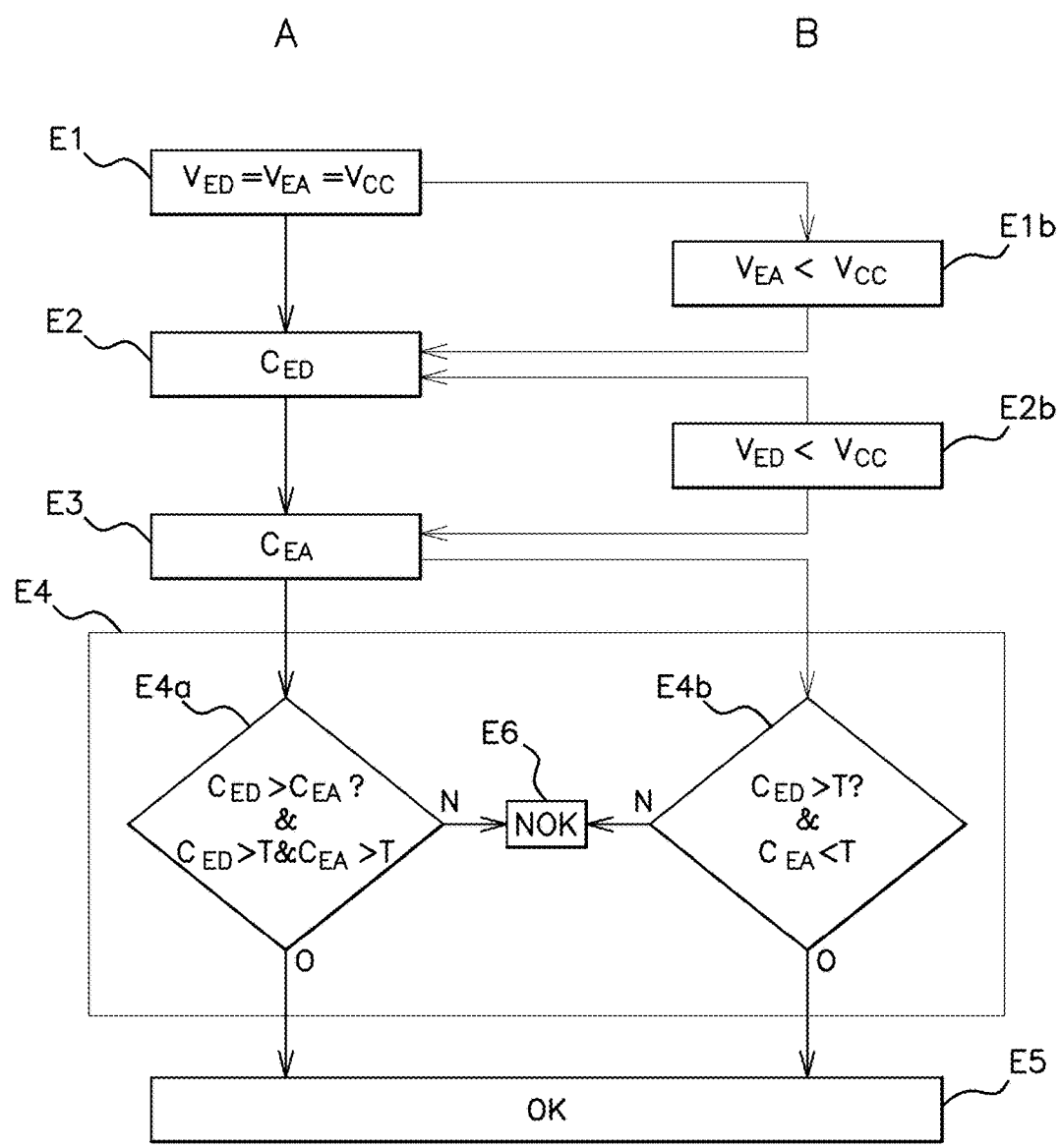
FIG. 6 is a flow chart illustrating the detection method according to the invention.

In a first embodiment of the detection method of the invention, illustrated by branch A in FIG. 6, the detection of an approach toward the first outer surface S1 is validated (step 5) only if the first value $C_{ED}$ is greater than the second value $C_{EA}$ and only if the first value $C_{ED}$ and the second value $C_{EA}$ are also each greater than a predetermined threshold value T, that is to say if:

$$C_{ED} > C_{EA}$$

and if $$C_{ED} > T \text{ where } C_{EA} > T$$

Otherwise the approach is a false positive (step 6).

Figure 4A:
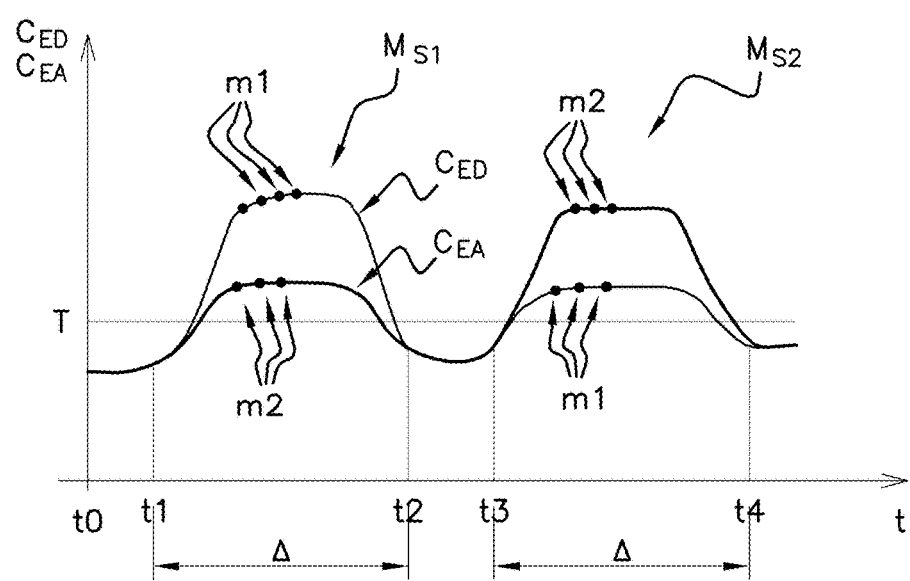
FIG. 4a shows in graph form the variations of capacitance of the detection electrode and the additional electrode as a function of time t, and in succession, when the user's hand is approaching the first outer surface S1 (detection validated), and then when the user's hand is approaching the second outer surface S2 (false positive), according to the first embodiment of the detection method according to the invention.

This is illustrated in FIG. 4a.

In the first step, the voltages at the terminals of the two said electrodes are identical and, if the user's hand is not near the handle P, the first value $C_{ED}$ of capacitance of the detection electrode is equal to the second value $C_{EA}$ of capacitance of the additional electrode; in other words $C_{ED} = C_{EA}$. This is illustrated in FIG. 4a, where $C_{ED} = C_{EA}$ between time t0 and time t1.

Subsequently, when the hand approaches the first outer surface S1 ($M_{S1}$) between instant t1 and instant t2, the first measured value $C_{ED}$ is greater than the second value $C_{EA}$. The detection is validated only if the approach is sufficient: that is to say, if the first value and the second value are greater than a predetermined threshold value T.

Conversely, if the hand approaches the second outer surface S2 ($M_{S2}$), between instant t3 and instant t4, the second value $C_{EA}$ is greater than the first value $C_{ED}$, both of said values being greater than the predetermined threshold value T. In this case, the detection of the approach is not validated.

It should be noted that, in this example, a single predetermined threshold value T is used to distinguish real approaches from false positives; however, it may also be feasible to use two different threshold values, namely a threshold value for validating the approach $M_{S1}$ and another threshold value for detecting an approach $M_{S2}$.

In a second embodiment of the detection method according to the invention, represented by branch B in FIG. 6, the method comprises a step 1 b, between step 1 and step 2, in which the voltage at the terminals of the additional electrode $V_{EA}$ is reduced by the voltage adjustment means M3 to a value below the supply voltage Vcc, and a step 2b, between step 2 and step 3, in which the voltage at the terminals of the detection electrode $V_{ED}$ is also reduced by the voltage adjustment means M3 to a value below the supply voltage Vcc.

In a preferred embodiment, in steps 1b and 2b both of said voltages $V_{EA}$ and $V_{ED}$ are connected to the electrical ground, and their respective values are therefore 0 volts.

In this second embodiment of the detection method of the invention, the detection of an approach toward the first outer surface S1 is validated (step 5) only if the first value $C_{ED}$ is greater than the predetermined threshold value T and if the second value $C_{EA}$ is below the predetermined threshold value T, that is to say if:

$$C_{ED} > T \text{ and } C_{EA} < T$$

Otherwise the approach is a false positive (step 6).

Figure 4B:
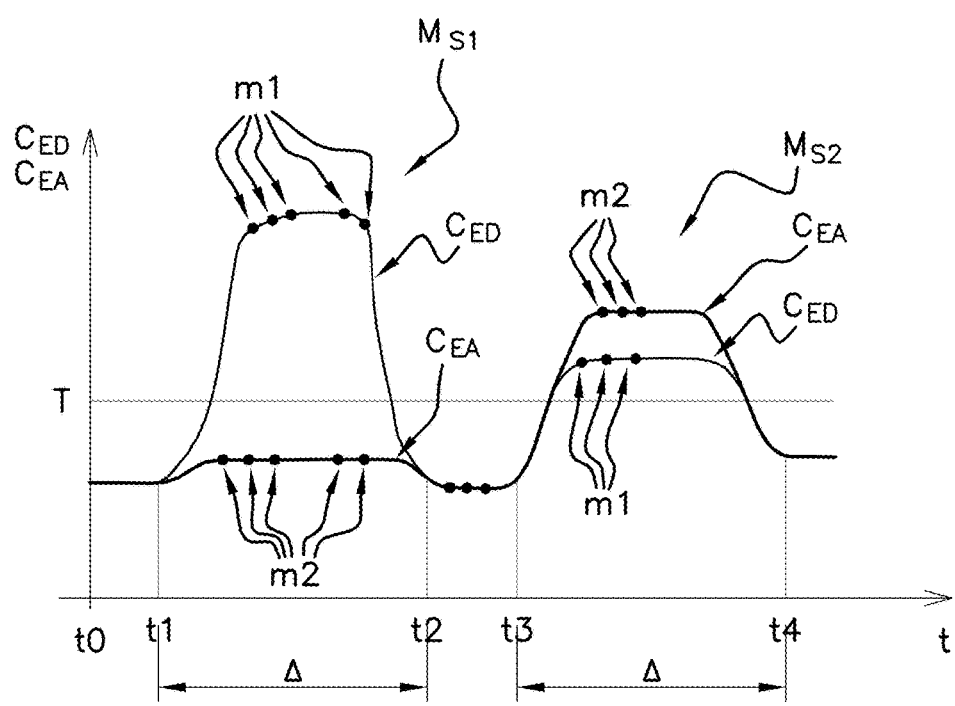
FIG. 4b shows in graph form the variations of capacitance of the detection electrode and the additional electrode as a function of time t, and in succession, when the user's hand is approaching the first outer surface S1 (detection validated), and then when the user's hand is approaching the second outer surface S2 (false positive), according to the second embodiment of the detection method according to the invention.

This is illustrated in FIG. 4b.

In the first step, the voltages at the terminals of the two said electrodes are identical and, if the user's hand is not near the handle P, the first value $C_{ED}$ of capacitance of the detection electrode is equal to the second value $C_{EA}$ of capacitance of the additional electrode; in other words $C_{ED} = C_{EA}$. This is illustrated in FIG. 4b, where $C_{ED} = C_{EA}$ between time t0 and time t1.

Subsequently, when the hand approaches the first outer surface S1 ($M_{S1}$) between instant t1 and instant t2, the first measured value $C_{ED}$ is greater than the predetermined threshold value T and the second value $C_{EA}$ is below the predetermined threshold value T.

Conversely, if the hand approaches the second outer surface S2 ($M_{S2}$), between instant t3 and instant t4, the second value $C_{EA}$ and the first value $C_{ED}$ are greater than the predetermined threshold value T. In this case, the detection of the approach is not validated: it is a false positive.

Figure 5:
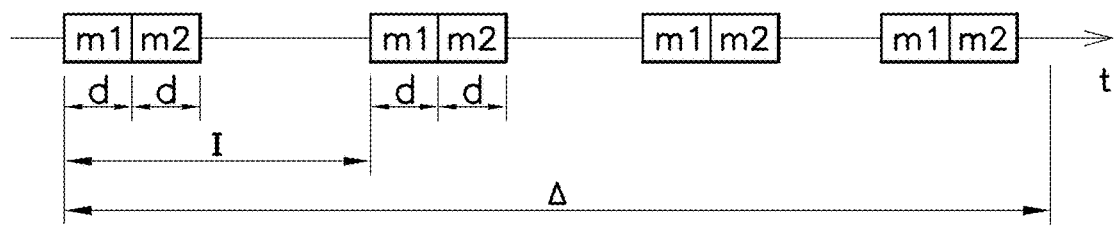
FIG. 5 shows schematically the series of measurements of the variations in capacitance of the detection electrode and the additional electrode, according to the detection method of the invention.

Step 1 to 3, in which the first value $C_{ED}$ and the second value $C_{ED}$ are measured, are repeated during a measurement period $\Delta$, in the following manner (see FIG. 5):

A first measurement m1 of the first value $C_{ED}$ (step 2) is immediately followed by a second measurement m2 (step 3) of the second value $C_{EA}$, as illustrated in FIG. 5. The first measurement m1 and the second measurement m2 each have an equal duration d, and are consecutive and repeated at regular intervals I corresponding to a predetermined frequency, as shown in FIG. 5.

For example:

d=1 ms

I=20 ms, and therefore f=1/0.02=50 Hz.

Step 4 of approach detection is then executed by comparing the mean first value $C_{EDmoy}$, which is the mean of the first measurements m1 during the measurement period $\Delta$, and the second mean value $C_{EAmoy}$, which is the mean of the second measurements m2 during the measurement period $\Delta$, with one another and/or with the predetermined threshold value T.

In the first embodiment, since the additional electrode EA is supplied with the same voltage Vcc as the detection electrode ED, the additional electrode EA widens the range of the detection electrode ED both toward the first surface S1 and toward the second surface S2.

Since the detection electrode ED is located near the first surface S1 and the additional electrode EA is located near the second surface S2, when the user brings his hand toward the first surface S1, during the measurement period Δ, the capacitance of the detection electrode $C_{ED}$ (or the first mean value $C_{EDmoy}$) is greater than the capacitance of the additional electrode $C_{EA}$ (or the second mean value $C_{EAmoy}$ respectively). Conversely, when the user brings his hand toward the second surface S2, the capacitance of the additional electrode $C_{EA}$ (or the second mean value $C_{EAmoy}$) is greater than the capacitance of the detection electrode $C_{ED}$ (or the first mean value $C_{EDmoy}$). By alternating the measurements m1, m2 of the capacitances of the two electrodes $C_{ED}$, $C_{EA}$ and by comparing their respective values, it is therefore possible to distinguish an unlocking detection (an approach toward the first surface S1) from a false positive (an approach toward the second surface S2). However, the detection will only be validated if the first and second values $C_{ED}$, $C_{EA}$ are both greater than a predetermined threshold value T, corresponding to the desired detection sensitivity.

In the second embodiment, when a first capacitance measurement m1 is made at the detection electrode ED, the voltage at the terminals of the additional electrode $V_{EA}$ is controlled so as to be below the voltage at the terminals of the detection electrode $V_{ED}$. Conversely, when a second capacitance measurement m2 is made at the additional electrode EA, the voltage at the terminals of the detection electrode ED is controlled so as to be below the voltage at the terminals of the additional electrode $V_{EA}$. In this case, the additional electrode EA and the detection electrode ED act alternately as shielding electrodes in relation to one another.

The additional electrode EA then has a lower detection sensitivity during an approach toward the first surface S1 and an increased sensitivity during an approach toward the second surface S2. Conversely, the detection electrode ED then has an increased detection sensitivity during an approach toward the first surface S1 and a lower sensitivity during an approach toward the second surface S2.

Thus, during the approach toward the first surface S1, within the measurement period Δ, the first value $C_{ED}$ (or the first mean value $C_{EDmoy}$) is greater than the second value $C_{EA}$ (or the second mean value $C_{EAmoy}$ respectively), and the second value $C_{EA}$ (or the second mean value $C_{EAmoy}$ respectively) is below the predetermined threshold value T, that is to say lower than the detection sensitivity, because its sensitivity is reduced. Conversely, during the approach toward the second surface S2, the first value (or the first mean value $C_{EDmoy}$) is lower than the second value $C_{EA}$ (or the second mean value $C_{EAmoy}$ respectively), but in this case both values $C_{ED}$, $C_{EA}$ ($C_{EDmoy}$, $C_{EAmoy}$) are greater than the predetermined threshold value T.

Preferably, in this second embodiment, during the first measurement m1 of the capacitance of the detection electrode $C_{ED}$, the additional electrode EA is electrically grounded. Conversely, during the second measurement m2 of the capacitance of the additional electrode $C_{EA}$, the detection electrode ED is electrically grounded. Both electrodes therefore act alternately as total shielding electrodes.

Both of the electrodes ED, EA then preferably detect an approach to only one side of the handle P. The detection electrode ED is then sensitive only to approaches toward the first surface S1, and the additional electrode EA is sensitive only to approaches toward the second surface S2.

Thus the invention advantageously provides high sensitivity of detection of an unlocking approach, while being robust to false positives.

For this purpose, the detection method of the invention usefully proposes the use of two electrodes in a complementary manner, the electrodes being used alternately as a detection electrode and a partial or total shielding element; more precisely, the invention proposes that, when one electrode is in detection mode, the other is in shielding mode.

The invention claimed is:

1. Method of detecting the approach of a user's hand toward a door handle (P) of a vehicle (V), having a first outer surface (S1) oriented toward the vehicle (V) and a second outer surface (S2) oriented toward the user, said handle (P) comprising at least one detection electrode (ED) and an additional electrode (EA), wherein said two electrodes (ED, EA) are positioned face to face in advance, said method comprises the following steps:
   Step 1: the detection electrode (ED) and the additional electrode (EA) are electrically connected to the same power supply source (Vcc),
   Step 1b: the voltage at the terminals of the additional electrode ($V_{EA}$) is reduced to a value lower than that of the supply voltage (Vcc),
   Step 2: a first value ($C_{ED}$) of capacitance, which varies on the approach of the user's hand, is measured at the terminals of the detection electrode (ED),
   Step 2b: the voltage at the terminals of the detection electrode ($V_{ED}$) is reduced to a value lower than that of the supply voltage (Vcc),
   Step 3: a second value ($C_{EA}$) of capacitance, which varies on the approach of the user's hand, is measured at the terminals of the additional electrode (EA),
   Step 4: the first value ($C_{ED}$) and the second value ($C_{EA}$) are compared, during a measurement period, with one another and/or with a predetermined threshold value (T), in order to detect the approach of a user's hand toward the first outer surface (S1) or toward the second outer surface (S2) and/or the contact of his hand with one of these surfaces.

2. Detection method according to claim 1, wherein, in step 1b, the additional electrode (EA) is electrically connected to the electrical ground.

3. Detection method according to claim 1, wherein, in step 2b, the detection electrode (ED) is electrically connected to the electrical ground.

4. Detection method according to claim 1, wherein steps 1 to 3 are repeated recurrently at a predetermined frequency (f) throughout the measurement period (Δ).

5. Detection method according to claim 4, wherein step 4 consists of:
   Step 4a: if, during the measurement period (Δ), the first value ($C_{ED}$) is greater than the second value ($C_{EA}$), and the first value ($C_{ED}$) and the second value ($C_{EA}$) are greater than the predetermined threshold value (T), then
   Step 5: the approach detection is validated, otherwise
   Step 6: there is no validation of the detection.

6. Detection method according to claim 1, wherein step 4 consists of:
   Step 4b: if, during the measurement period (Δ), the first value ($C_{ED}$) is greater than the predetermined threshold value (T), and if the second value ($C_{EA}$) is lower than the predetermined threshold value (T), then
   Step 5: the approach detection is validated, otherwise
   Step 6: there is no validation of the detection.

7. Detection method according to claim 1, the detection electrode (ED) being located near the first outer surface (S1) and the additional electrode (EA) being located between the second outer surface (S2) and the detection electrode (ED), wherein, in step 4, the approach detection consists in detection toward the first outer surface (S1).

8. Detection method according to claim 2, wherein, in step 2b, the detection electrode (ED) is electrically connected to the electrical ground.

9. Detection method according to claim 2, wherein steps 1 to 3 are repeated recurrently at a predetermined frequency (f) throughout the measurement period ($\Delta$).

10. Detection method according to claim 2, wherein step 4 consists of:
Step 4b: if, during the measurement period ($\Delta$), the first value ($C_{ED}$) is greater than the predetermined threshold value (T), and if the second value ($C_{EA}$) is lower than the predetermined threshold value (T), then
step 5: the approach detection is validated, otherwise
Step 6: there is no validation of the detection.

11. Detection method according to claim 2, the detection electrode (ED) being located near the first outer surface (S1) and the additional electrode (EA) being located between the second outer surface (S2) and the detection electrode (ED), said method is wherein, in step 4, the approach detection consists in detection toward the first outer surface (S1).

12. Detection method according to claim 3, wherein steps 1 to 3 are repeated recurrently at a predetermined frequency (f) throughout the measurement period ($\Delta$).

13. Detection method according to claim 3, wherein step 4 consists of:
Step 4b: if, during the measurement period ($\Delta$), the first value ($C_{ED}$) is greater than the predetermined threshold value (T), and if the second value ($C_{EA}$) is lower than the predetermined threshold value (T), then
Step 5: the approach detection is validated, otherwise
Step 6: there is no validation of the detection.

14. Detection method according to claim 3, the detection electrode (ED) being located near the first outer surface (S1) and the additional electrode (EA) being located between the second outer surface (S2) and the detection electrode (ED), wherein, in step 4, the approach detection consists in detection toward the first outer surface (S1).

15. Detection method according to claim 4, the detection electrode (ED) being located near the first outer surface (S1) and the additional electrode (EA) being located between the second outer surface (S2) and the detection electrode (ED), wherein, in step 4, the approach detection consists in detection toward the first outer surface (S1).

16. Detection method according to claim 5, the detection electrode (ED) being located near the first outer surface (S1) and the additional electrode (EA) being located between the second outer surface (S2) and the detection electrode (ED), wherein, in step 4, the approach detection consists in detection toward the first outer surface (S1).

17. Device (D') for detecting the approach of a user's hand toward a door handle (P) of a vehicle (V) and/or the contact of the hand therewith, the handle having a first outer surface (S1) oriented toward the vehicle (V) and a second outer surface (S2) oriented toward the user, said device (D') comprising at least one voltage source (Vcc), a detection electrode (ED), an additional electrode (EA), and means (M1) for measuring a first value ($C_{ED}$) of capacitance at the terminals of the detection electrode (ED) and a second value ($C_{EA}$) of capacitance at the terminals of the additional electrode (AE), wherein said two electrodes (EA, ED) are positioned face to face, said device (D') further comprises:
first connection means (K1) for connecting the detection electrode (ED) to the measurement means (M1),
second connection means (K2) for connecting the additional electrode (EA) to the measurement means (M1),
control means (M2) for controlling the first and second connection means (K1, K2), as well as
means (M3) for adjusting the voltage at the terminals of the detection electrode ($V_{ED}$) and the voltage at the terminals of the additional electrode ($V_{EA}$), for independently controlling the voltage at the terminals of the detection electrode ($V_{ED}$) and the voltage at the terminals of the additional electrode ($V_{EA}$) from a minimum value equal to the electrical ground to a maximum voltage equal to the supply voltage (Vcc),
a clock (H) connected to the control means (M2),
means (M4) for comparing the first value ($C_{ED}$) and the second value ($C_{EA}$) with one another and/or with a predetermined threshold value (T).

18. Detection device (D') according to claim 17, further comprising means for calculating a mean of the first value ($C_{EDmoy}$) and means for calculating a mean of the second value ($C_{EAmoy}$) during a measurement period ($\Delta$), and means (M4) for comparing the mean of the first value ($C_{EDmoy}$) and the mean of the second value ($C_{EAmoy}$) with one another and/or with the predetermined threshold value (T).

19. Motor vehicle door handle (P), comprising a detection device (D') according to claim 17.

20. Motor vehicle (V), comprising a detection device (D') according to claim 17.

* * * * *